United States Patent
Kang

(10) Patent No.: US 9,165,768 B2
(45) Date of Patent: Oct. 20, 2015

(54) METHOD FOR DEPOSITION OF SILICON CARBIDE AND SILICON CARBIDE EPITAXIAL WAFER

(71) Applicant: LG INNOTEK CO., LTD., Seoul (KR)

(72) Inventor: Seok Min Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/365,942

(22) PCT Filed: Dec. 13, 2012

(86) PCT No.: PCT/KR2012/010867
§ 371 (c)(1),
(2) Date: Jun. 16, 2014

(87) PCT Pub. No.: WO2013/089463
PCT Pub. Date: Jun. 20, 2013

(65) Prior Publication Data
US 2014/0319545 A1    Oct. 30, 2014

(30) Foreign Application Priority Data

Dec. 16, 2011 (KR) .................. 10-2011-0136880
Dec. 19, 2011 (KR) .................. 10-2011-0137819
Dec. 19, 2011 (KR) .................. 10-2011-0137820
Dec. 19, 2011 (KR) .................. 10-2011-0137821

(51) Int. Cl.
*H01L 21/02* (2006.01)
*C23C 16/02* (2006.01)
*C30B 25/02* (2006.01)
*C23C 16/32* (2006.01)
*C30B 29/36* (2006.01)

(52) U.S. Cl.
CPC ...... *H01L 21/02529* (2013.01); *C23C 16/0227* (2013.01); *C23C 16/325* (2013.01); *C30B 25/02* (2013.01); *C30B 29/36* (2013.01); *H01L 21/0262* (2013.01); *H01L 21/02628* (2013.01)

(58) Field of Classification Search
None
See application file for complete search history.

(56) References Cited

U.S. PATENT DOCUMENTS

| | | | |
|---|---|---|---|
| 3,960,619 A * | 6/1976 | Seiter | 117/97 |
| 2006/0169668 A1 | 8/2006 | Samoilov | |
| 2011/0278596 A1 | 11/2011 | Aigo et al. | |
| 2012/0146056 A1 | 6/2012 | Momose et al. | |
| 2012/0208302 A1* | 8/2012 | Itoh et al. | 438/9 |

FOREIGN PATENT DOCUMENTS

JP      2011-049496 A      3/2011
KR     10-2011-0093892 A   8/2011

OTHER PUBLICATIONS

International Search Report in International Application No. PCT/KR2012/010867, filed Dec. 13, 2012.

(Continued)

*Primary Examiner* — Thao P Le
(74) *Attorney, Agent, or Firm* — Saliwanchik, Lloyd & Eisenschenk

(57) ABSTRACT

A method for deposition of silicon carbide according to an embodiment includes preparing a wafer in a susceptor; introducing first etching gas into the susceptor; introducing second etching gas into the susceptor; producing an intermediate compound by introducing a reactive raw material into the susceptor; and forming a silicon carbide epitaxial layer on the wafer by reacting the intermediate compound with the wafer.

18 Claims, 3 Drawing Sheets

(56) References Cited

OTHER PUBLICATIONS

Tsunenobu Kimoto et al. "Reduction of doping and trap concentrations in 4H-SiC epitaxial layers grown by chemical vapor disposition," Applied Physics Letters, Oct. 22, 2001, vol. 79, No. 17, pp. 2761-2762.

S. Nakazawa et al. "High-purity 4H-SiC epitaxial growth by hot-wall chemical vapor deposition," Journal of Crystal Growth 237-239 (2002), pp. 1213-1217.

* cited by examiner

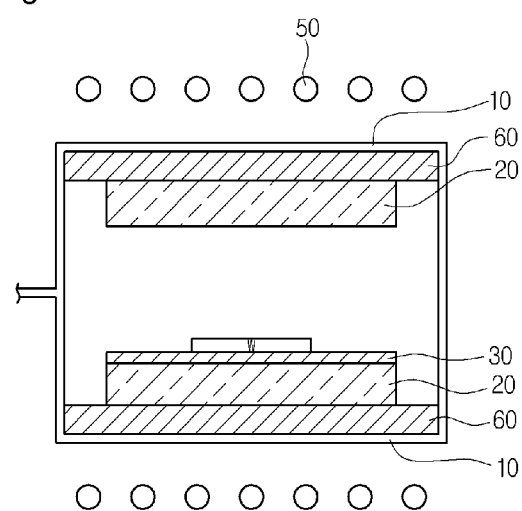

METHOD FOR DEPOSITION OF SILICON CARBIDE AND SILICON CARBIDE EPITAXIAL WAFER

CROSS-REFERENCE TO RELATED APPLICATIONS

This application is the U.S. national stage application of International Patent Application No. PCT/KR2012/0106880, filed Dec. 13, 2012, which claims priority to Korean Application Nos.10-2011-0136880, filed Dec. 16,2011; 10-2011-0137819, filed Dec. 19, 2011; 10-2011-0137820,filed Dec. 19, 2011; and 10-2011-0137821, filed Dec. 19, 2011, the disclosures of each of which are incorporated herein by reference in their entirety.

TECHNICAL FIELD

The embodiment relates to a method for deposition of silicon carbide and a silicon carbide epitaxial wafer.

BACKGROUND ART

In general, among technologies to form various thin films on a substrate or a wafer, a CVD (Chemical Vapor Deposition) scheme has been extensively used. The CVD scheme results in a chemical reaction. According to the CVD scheme, a semiconductor thin film or an insulating layer is formed on a wafer surface by using the chemical reaction of a source material.

The CVD scheme and the CVD device have been spotlighted as an important thin film forming technology due to the fineness of the semiconductor device and the development of high-power and high-efficiency LED. Recently, the CVD scheme has been used to deposit various thin films, such as a silicon layer, an oxide layer, a silicon nitride layer, a silicon oxynitride layer, or a tungsten layer, on a wafer.

For example, to deposit a silicon carbide thin film on a substrate or a wafer, a reactive raw material capable of reacting with the wafer needs to be introduced. According to the related art, a silicon carbide epitaxial layer is deposited by introducing silane (SiH4) and ethylene (C2H4) serving as a standard precursor or methyltrichlorosilane (MTS) as a raw material, heating the raw material to produce an intermediate compound such as CH3 or SiClx, and introducing the intermediate compound to react the intermediate compound with a wafer disposed in a susceptor.

However, carbon and silicon are not uniformly distributed on a surface of the wafer on which the silicon carbide epitaxial thin film layer is deposited but the silicon is highly distributed on the surface of the wafer. In this case, since the silicon increases surface roughness of the wafer, the silicon may cause a defect in the epitaxial wafer.

Therefore, a method capable of modifying a surface of the silicon carbide wafer is required.

DISCLOSURE OF INVENTION

Technical Problem

The embodiment provides a method of fabricating a silicon carbide epitaxial wafer which fabricates the silicon carbide epitaxial wafer having surface roughness of 1 nm or less by modifying a surface of the wafer to a carbon (C)-rich state and a silicon carbide epitaxial wafer.

Solution to Problem

According to the embodiment, there is provided a method for deposition of silicon carbide, the method including: preparing a wafer in a susceptor; introducing first etching gas into the susceptor; introducing second etching gas into the susceptor; producing an intermediate compound by introducing a reactive raw material into the susceptor; and forming a silicon carbide epitaxial layer on the wafer by reacting the intermediate compound with the wafer.

According to the embodiment, there is provided a method for deposition of silicon carbide including: preparing a wafer; heating the wafer at a first temperature; introducing second etching gas into a susceptor; introducing first etching gas into the susceptor; cooling an inside of the susceptor at a second temperature; producing an intermediate raw material by introducing a reactive raw material into the susceptor; and forming a silicon carbide epitaxial layer on the wafer by reacting the intermediate compound with the wafer.

Advantageous Effects of Invention

The method for deposition of silicon carbide can modify the surface of the silicon carbide wafer to the C-rich state having rich carbon by introducing first etching gas including hydrogen chloride and/or second etching gas including carbon before depositing the silicon carbon material on the silicon carbide wafer.

Accordingly, before depositing the silicon carbide wafer, surface roughness and a surface defect of the silicon carbide wafer can be reduced.

That is, according to the embodiment, the surface roughness of the silicon carbide epitaxial wafer, on which the silicon carbide epitaxial layer is deposited can be reduced to 1 nm or less, and a high-quality silicon carbide epitaxial wafer having no surface defect can be fabricated.

BRIEF DESCRIPTION OF DRAWINGS

FIG. 10 is a sectional view taken along line I-I' of FIG. 9.

MODE FOR THE INVENTION

Figure 1:
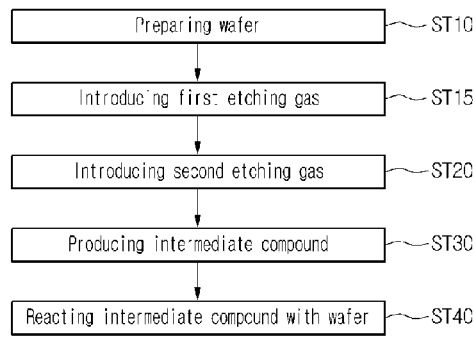
FIG. 1 is a flowchart showing a method for deposition of silicon carbide according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each a layer (or film), each region, each pattern, or each structure shown in the drawings may be exaggerated, omitted or schematically drawn for the purpose of convenience or clarity. In addition, the size of elements does not utterly reflect an actual size.

Hereinafter, a method for deposition of silicon carbide and a silicon carbide epitaxial wafer according to the first embodiment will be described with reference to FIGS. 1 to 10.

Referring to FIG. 1, the method for deposition of silicon carbide according to the first embodiment includes the steps of preparing a wafer (ST10); introducing second etching gas into a susceptor (ST20); producing an intermediate compound by introducing a reactive raw material into the susceptor (ST30); and forming a silicon carbide epitaxial layer on the wafer by reacting the intermediate compound with the wafer (ST40). The method for deposition of silicon carbide according to the first embodiment may further include introducing first etching gas into the susceptor (ST15) before the introducing of the second etching gas into the susceptor (ST20).

In step ST10 of preparing the wafer, the wafer may be placed in the susceptor. In this case, the wafer may include a silicon carbon wafer.

After that, in step ST20 of introducing the second etching gas into the susceptor, a carbon compound including alkane (CnH2n+2, where 1≤n≤3), alkene (CnH2n−2, where 2≤n≤3) or alkyne (CnH2n, where 2≤n≤3) may be introduced into the susceptor. After the susceptor is heated at a temperature of 1500° C. or higher, the carbon compound may be introduced into the susceptor. Preferably, after the susceptor is heated at a temperature in the range of about 1500° C. to about 1575° C., the second etching gas may be introduced into the susceptor.

The method for deposition of silicon carbide according to the first embodiment may further include introducing first etching gas into the susceptor (ST15) before the introducing of the second etching gas into the susceptor (ST20).

The first etching gas may include hydrogen chloride (HCl). After the susceptor is heated at a temperature of 1500° C. or higher, the first etching gas may be introduced into the susceptor. Preferably, after the susceptor is heated at a temperature in the range of about 1500° C. to about 1575° C., the first etching gas may be introduced into the susceptor.

That is, the first etching gas and the second etching gas may be introduced into the susceptor at a temperature in the range of about 1500° C. to about 1575° C. In other words, the first etching gas and the second etching gas are introduced before the reactive raw material is ionized to the intermediate compound.

Only the second etching gas or both of the first etching gas and the second etching gas may be introduced in the susceptor. When both of the first etching gas and the second etching gas are introduced, the first etching gas is firstly introduced and then the second etching gas is introduced.

Introduced amounts of the first etching gas and the second etching gas may be different from each other. Preferably, the introduced amount of the second etching gas may be more than the introduced amount of the first etching gas. For example, the first etching gas of about 120 ml/min may be introduced, and the second etching gas of about 270 ml/min may be introduced.

The first etching gas and the second etching gas may be repeatedly introduced for about one minute to about 10 minutes. That is, the first etching gas and the second etching gas may be sequentially and repeatedly supplied into the susceptor. After introducing the first etching gas, the second etching gas may be repeatedly introduced several times.

The first etching gas and/or the second etching gas may etch a surface of the silicon carbide wafer.

Figure 3:
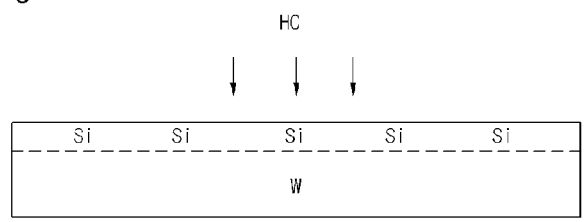
FIG. 3 is a view showing a process of introducing etching gas on a silicon carbide wafer.
Figure 4:
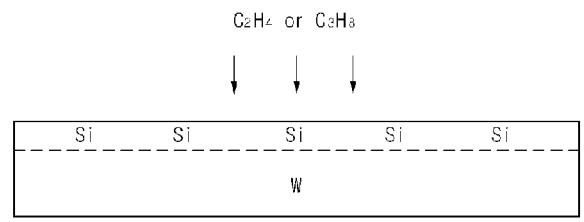
FIG. 4 is a view showing a process of introducing a carbon source on the silicon carbide wafer.
Figure 5:
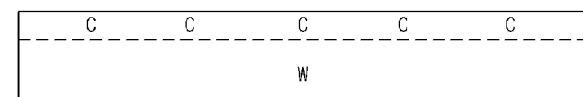
FIG. 5 is a view showing a surface state of the silicon carbide wafer on which the carbon source is introduced.
Figure 6:
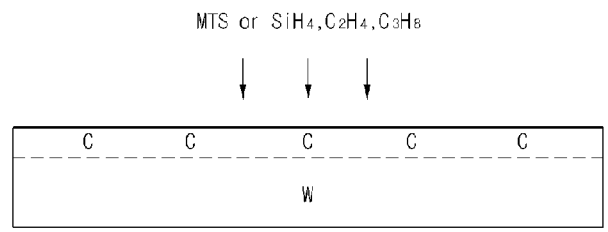
FIG. 6 is a view showing a process of depositing an epitaxial layer by introducing a reactive raw material on the silicon carbide wafer.

That is, referring to FIGS. 3 and 4, silicon (SI) may be richer than carbon (C) on the surface of a silicon carbide bulk wafer. However, the silicon forms a predetermined protrusion on the surface of the wafer so that the surface of the silicon carbide wafer becomes rough, thereby increasing surface roughness. The surface roughness may result in defects on the silicon carbide wafer. Accordingly, when a silicon carbide epitaxial layer is deposited on the silicon carbide wafer, the defect may be expanded, exerting a bad influence upon the silicon carbide epitaxial layer.

The method for deposition of silicon carbide according to the first embodiment may reduce surface roughness by modifying a surface of the wafer having rich silicon. That is, before introducing a reactive raw material for depositing an epitaxial layer into the susceptor, the surface of the wafer is modified by introducing the first etching gas and the second etching gas into the susceptor. The hydrogen chloride and/or the carbon compound is introduced into the susceptor at a predetermined temperature range, preferably, at a temperature lower than a reactive temperature of the reactive raw material to modify the surface of the wafer, so that the surface of the wafer may be modified to a state having rich carbon, that is, a carbon rich state.

Accordingly, after the surface of the silicon carbide wafer is etched by hydrogen chloride, a carbon layer may be formed by depositing carbon included in the carbon compound on the surface of the silicon carbide wafer. Accordingly, a protrusion by the silicon formed on the surface of the wafer may be removed, and a silicon carbide wafer having a flat surface may be formed.

Then, in step ST40 of producing an intermediate compound by introducing a reactive raw material into the susceptor and step ST50 of forming a silicon carbide epitaxial layer on the wafer by reacting the intermediate compound with the wafer, the intermediate compound reacting with the wafer or the substrate is produced in the susceptor using the reactive raw material, and the silicon carbide epitaxial layer may be formed by introducing the intermediate compound into the susceptor and reacting the intermediate compound with the wafer.

The reactive raw material may include a liquid raw material and a gaseous raw material. Preferably, the liquid raw material may include methylchlorosilane (MTS, and the gaseous raw material may include silane (SiH4) and ethylene (C2H4) or silane (SiH4) and propane (C3H8). However, the embodiment is not limited thereto, and the raw materials may include various raw materials having carbon and silicon.

A process of forming a silicon carbide epitaxial layer by reacting the intermediate compound with the wafer will be described with reference to FIGS. 8 to 10.

Figure 8:
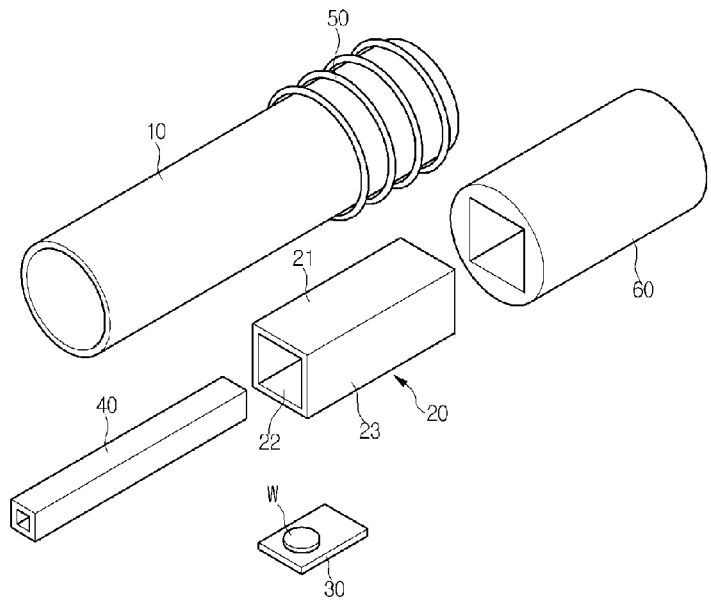
FIG. 8 is an exploded perspective view showing a deposition apparatus according to the embodiment.
Figure 9:
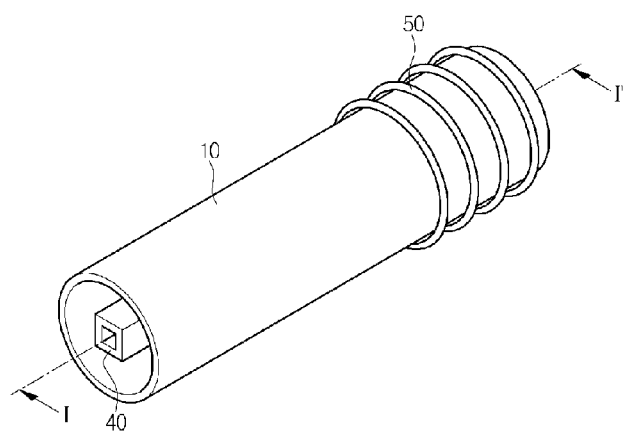
FIG. 9 is a perspective view showing a deposition apparatus according to the embodiment.

Referring to FIGS. 8 to 10, the deposition apparatus according to the embodiment includes a chamber 10, a susceptor 20, a source gas line 40, a wafer holder 30, and an induction coil 50.

The chamber 10 may has a cylindrical shape. In addition, the chamber 10 may have or a rectangular box shape. The chamber 10 may receive the susceptor 20, the source gas line 40, and the wafer holder 30.

Both ends of the chamber 10 may be closed, and the chamber 10 may prevent external gas from being introduced into the chamber 10 to maintain a vacuum degree. The chamber 10 may include quartz representing superior mechanical strength and superior chemical durability. The chamber 10 may represent an improved heat resistance property.

In addition, an adiabatic part 60 may be further provided in the chamber 10. The adiabatic part 60 may preserve heat in the chamber 10. A material constituting the adiabatic part 60 may include nitride ceramic, carbide ceramic, or graphite.

The susceptor 20 is provided in the chamber 10. The susceptor 20 receives the source gas line 40 and the wafer holder 30. In addition, the susceptor 20 receives a substrate such as the wafer W. In addition, the reactive gas is introduced into the susceptor 20 through the source gas line 40.

As shown in FIG. 9, the susceptor 20 may include a susceptor upper plate 21, a susceptor lower plate 22, and susceptor lateral plates 23. In addition, the susceptor upper and lower plates 21 and 22 face each other.

The susceptor 20 may be manufactured by placing the susceptor upper and lower plates 21 and 22, placing the susceptor lateral plates 23 at both sides of the susceptor upper and lower plates 21 and 22, and bonding the susceptor upper and lower plates 21 and 22 with the susceptor lateral plates 23.

However, the embodiment is not limited thereto. For instance, a space for a gas passage can be made in the rectangular parallelepiped susceptor 20.

The susceptor 20 includes graphite representing a high heat resistance property and a superior workability, so that the susceptor 20 can endure under the high temperature condition. Further, the susceptor 20 may have a structure in which a graphite body is coated with silicon carbide. Meanwhile, the susceptor 20 may be induction-heated.

Reactive gas supplied from the susceptor 200 is decomposed into an intermediate compound by heat, and then the intermediate compound may be deposited on the wafer W. For example, the reactive gas may be formed from methyltrichlorosilane (MTS) serving as a liquid raw material or silane and ethylene or silane and propane serving as a gaseous raw material The reactive gas is decomposed into radical including silicon or carbon, and a silicon carbide epitaxial layer may be grown on the wafer W. In more detail, the radical may include $CH_x?(1 \leq x < 4)$ or $SiCl_x?(1 \leq x < 4)$ having $CH_3?$, $SiCl?$, $SiCl_2?$, $SiHCl?$, or $SiHCl_2$.

The source gas line 40 may have or a rectangular box shape. For example, a material constituting the source gas line 40 may include quartz.

The wafer holder 30 is disposed in the susceptor 20. In detail, the wafer holder 30 may be disposed at a rear portion of the susceptor 20 based on a flow direction of source gas. The wafer holder 30 supports the wafer W. For example, a material used for the wafer holder 30 may include silicon carbide or graphite.

The induction coil 50 is disposed at an outer side of the chamber 10. In detail, the induction coil 50 may surround an outer peripheral surface of the chamber 10. The induction coil 50 may induction-heat the susceptor 20 through electromagnetic induction. The induction coil 50 may be wound around the outer peripheral surface of the chamber 10.

The susceptor 20 may be heated at a temperature in the range of about 1500° C. to about 1700° C. As described above, during a time period at which the temperature is increased in the range of about 1500° C. to about 1575° C., a surface of the wafer can be modified to a carbon-rich state by introducing the first etching gas and/or the second etching gas.

Next, the reactive gas is decomposed into an intermediate compound at the temperature in the range of about 1575° C. to about 1700° C., and then the intermediate compound is introduced into the susceptor 20 and injected to the wafer W. A silicon carbide epitaxial layer is formed on the wafer W by the radical injected to the wafer W.

As described above, an apparatus for growing a silicon carbide epitaxial layer according to the embodiment may form a thin film such as the epitaxial layer on a substrate such as the wafer W, and discharge remaining gas to the outside through a discharge line which is disposed at an end of the susceptor 20.

Figure 7:
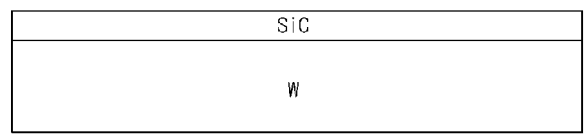
FIG. 7 is a view showing the silicon carbide epitaxial wafer according the embodiment.

FIG. 7 illustrates a silicon carbide epitaxial wafer prepared by the method for deposition of the silicon carbide. Since a silicon carbide layer is deposited after the surface of the wafer is modified to a carbon-rich state having rich carbon under the environment having rich silicon, a silicon carbide epitaxial wafer having surface roughness of 1 nm or less, preferably, in the range of 0.1 nm to 1 nm with reduced defect may be fabricated.

That is, since the silicon carbide epitaxial wafer is deposited between carbon layers serving as a buffer layer after the carbon layers are deposited between the silicon carbide epitaxial wafer and the silicon carbide epitaxial layer by modifying the surface of the silicon carbide wafer by the first etching gas and the second etching gas, a high-quality silicon carbide epitaxial wafer having a reduced surface roughness and having no surface defects can be fabricated.

Hereinafter, a method for deposition of silicon carbide and a silicon carbide epitaxial wafer according to the second embodiment will be described with reference to FIGS. 2 to 10. A description of the same parts of the method for deposition of silicon carbide according to the second embodiment as those of the method for deposition of silicon carbide according to the first embodiment is omitted. That is, the description of the method for deposition of silicon carbide according to the second embodiment may be basically incorporated with the description of the method for deposition of silicon carbide according to the first embodiment.

Figure 2:
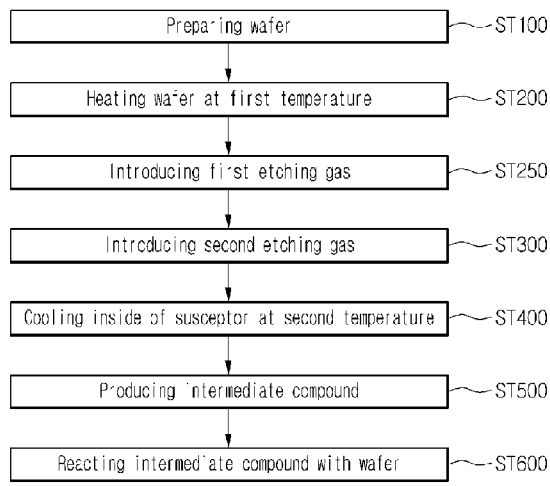
FIG. 2 is a flowchart showing a method for deposition of silicon carbide according to a second embodiment.

Referring to FIG. 2, the method for deposition of silicon carbide according to the second embodiment may include preparing a wafer (ST100); heating the wafer at a first temperature (ST200); introducing second etching gas into a susceptor (ST300); cooling an inside of the susceptor at a second temperature (ST400); producing an intermediate raw material by introducing a reactive raw material into the susceptor (ST500); and forming a silicon carbide epitaxial layer on the wafer by reacting the intermediate compound with the wafer (ST600). The method for deposition of silicon carbide according to the second embodiment may further include introducing first etching gas in the susceptor (ST250) before the introducing of the second etching gas in the susceptor (ST300).

In step ST100 of preparing the wafer, the wafer may be placed in the susceptor. In this case, the wafer may be a silicon carbon wafer.

After that, in step ST200 of heating the wafer at the first temperature, the suceptor may be heated at the first temperature. The first temperature may be different from the second temperature. Preferably, the first temperature may be higher than the second temperature. More preferably, the first temperature may be greater than the second temperature by a temperature in the range of about 100° C. to about 200° C. In detail, the first temperature may be in the range of about 1700° C. to about 1900° C.

After that, in step ST300 of introducing the second etching gas into the susceptor, a carbon compound including alkane ($C_nH_{2n+2}$, where $1 \leq n \leq 3$), alkene ($C_nH_{2n-2}$, where $2 \leq n \leq 3$) or alkyne ($C_nH_{2n}$, where $2 \leq n \leq 3$) may be introduce into the susceptor. After the susceptor is heated at a first temperature range, the carbon compound may be introduced. Preferably, the second etching gas may be introduced at a temperature in the range of about 1700° C. to about 1900° C.

The method for deposition of silicon carbide according to the second embodiment may further include introducing first etching gas into the susceptor (ST250) before the introducing of the second etching gas into the susceptor (ST300).

The first etching gas may include hydrogen chloride (HCl). After the susceptor is heated at the first temperature range, the first etching gas may be introduced. Preferably, the first etching gas may be introduced at a temperature in the range of about 1700° C. to about 1900° C.

That is, the first etching gas and the second etching gas may be introduced into the susceptor at a temperature in the range of about 1700° C. to about 1900° C. In detail, the first etching gas and the second etching gas may be introduced at a temperature higher than a reactive temperature of the reactive raw material.

Only the second etching gas or both of the first etching gas and the second etching gas may be introduced into the susceptor. When both of the first etching gas and the second etching gas are introduced, the first etching gas is firstly introduced and then the second etching gas is introduced.

Introduced amounts of the first etching gas and the second etching gas may be different from each other. Preferably, the introduced amount of the second etching gas may be more than the introduced amount of the first etching gas. For example, the first etching gas of about 120 ml/min may be introduced, and the second etching gas of about 270 ml/min may be introduced.

The first etching gas and the second etching gas may be repeatedly introduced for about one minute to about 10 minutes. That is, the first etching gas and the second etching gas may be sequentially and repeatedly supplied into the susceptor. After introducing the first etching gas, the second etching gas may be repeatedly introduced several times.

The first etching gas and/or the second etching gas may etch a surface of the silicon carbide wafer.

That is, referring to FIGS. 3 and 4, silicon (SI) may be richer than carbon (C) on the surface of a silicon carbide bulk wafer. However, the silicon forms a predetermined protrusion on the surface of the wafer so that the surface of the silicon carbide wafer becomes rough, thereby increasing surface roughness. The surface roughness may result in defects on the silicon carbide wafer. Accordingly, when a silicon carbide epitaxial layer is deposited on the silicon carbide wafer, the defect may be expanded, exerting a bad influence upon the silicon carbide epitaxial layer.

The method for deposition of silicon carbide according to the second embodiment may reduce surface roughness by modifying a surface of the wafer having rich silicon. That is, before introducing a reactive raw material for depositing an epitaxial layer into the susceptor, the surface of the wafer is modified by introducing the first etching gas and the second etching gas into the susceptor. The hydrogen chloride and/or the carbon compound is introduced into the susceptor at a predetermined temperature range, preferably, at a temperature lower than a reactive temperature of the reactive raw material to modify the surface of the wafer, so that the surface of the wafer may be modified to a state having rich carbon, that is, a carbon rich state.

Accordingly, after the surface of the silicon carbide wafer is etched by hydrogen chloride, a carbon layer may be formed by depositing carbon included in the carbon compound on the surface of the silicon carbide wafer. Accordingly, a protrusion by the silicon formed on the surface of the wafer may be removed, and a silicon carbide wafer having a flat surface may be formed.

Next, in step ST400 of cooling the inside of the susceptor at the second temperature, the temperature inside the susceptor may be reduced to the second temperature. That is, the second temperature may be lower than the first temperature by a temperature in the range of about 100° C. to about 200° C. In detail, the second temperature may be a temperature capable of ionizing the reactive gas. Preferably, the second temperature may be in the range of about 1500° C. to about 1700° C.

Then, in step ST500 of producing an intermediate compound by introducing a reactive raw material into the susceptor and step ST600 of forming a silicon carbide epitaxial layer on the wafer by reacting the intermediate compound with the wafer, the intermediate compound reacting with the wafer or the substrate is produced in the susceptor using the reactive raw material, and the silicon carbide epitaxial layer may be formed by introducing the intermediate compound into the susceptor and reacting the intermediate compound with the wafer.

The reactive raw material may include a liquid raw material and a gaseous raw material. Preferably, the liquid raw material may include methylchlorosilane (MTS, and the gaseous raw material may include silane ($SiH_4$) and ethylene ($C_2H_4$) or silane ($SiH_4$) and propane ($C_3H_8$). However, the embodiment is not limited thereto, and the raw materials may include various raw materials having carbon and silicon.

The step of forming a silicon carbide epitaxial layer on the wafer by reacting the intermediate compound with the wafer is the same as that of the first embodiment, and thus a description thereof is omitted.

FIG. 7 illustrates a silicon carbide epitaxial wafer prepared by the method for deposition of the silicon carbide. Since a silicon carbide layer is deposited after the surface of the wafer is modified to a carbon-rich state having rich carbon under the environment having rich silicon, a silicon carbide epitaxial wafer having surface roughness of 1 nm or less, preferably, in the range of 0.1 nm to 1 nm with reduced defect may be fabricated.

That is, since the silicon carbide epitaxial wafer is deposited between carbon layers serving as a buffer layer after the carbon layers are deposited between the silicon carbide epitaxial wafer and the silicon carbide epitaxial layer by modifying the surface of the silicon carbide wafer by the first etching gas and the second etching gas, a high-quality silicon carbide epitaxial wafer having a reduced surface roughness and having no surface defects can be fabricated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for deposition of silicon carbide, the method comprising:
   preparing a silicone carbide wafer in a susceptor;
   modifying a surface of the silicon carbide wafer;
   producing an intermediate compound by introducing a reactive raw material into the susceptor; and
   forming a silicon carbide epitaxial layer, after modifying the surface of the silicon carbide wafer, on the silicon carbide wafer by reacting the intermediate compound with the silicon carbide wafer,
   wherein modifying a surface of the silicon carbide wafer comprises introducing at least one of a first and a second etching gas into the susceptor,
   wherein the first etching gas comprises hydrogen chloride (HCl), and
   wherein the second etching gas comprises at least one of alkane (CnH2n+2, where $1 \leq n \leq 3$), alkene (CnH2n–2, where $2 \leq n \leq 3$), and alkyne (CnH2n, where $2 \leq n \leq 3$).

2. The method of claim 1, wherein the intermediate compound comprises $CHx.(1 \leq x < 4)$ and $SiClx.(1 \leq < x < 4)$.

3. The method of claim 1, wherein the first etching gas or the second etching gas is introduced at a temperature in a range of about 1500° C. to about 1575° C.

4. The method of claim 1, wherein the intermediate compound is produced by introducing the reactive raw material at a temperature in a range of about 1550° C. to about 1700° C.

5. The method of claim 1, further comprising heating the wafer at a first temperature after the preparing of the wafer in the susceptor.

6. The method of claim 5, further comprising cooling the susceptor at a second temperature after the introducing of the second etching gas.

7. The method of claim 6, wherein the first temperature is higher than the second temperature.

8. The method of claim 7, wherein the first temperature is higher than the second temperature by a temperature in a range of about 100° C. to about 200° C.

9. The method of claim 6, wherein the first temperature is in a range of about 1700° C. to about 1900° C., and the second temperature is in a range of about 1500° C. to about 1700° C.

10. A silicon carbide epitaxial wafer fabricated by the method for deposition of silicon carbide according to claim 1, and having surface roughness of about 1 nm or less.

11. The method of claim 1, wherein the reactive raw material comprises at least one of carbon(C), silicon(Si), and chlorine(Cl).

12. The method of claim 4, wherein at least one of the first etching gas and the second etching gas is introduced before the reactive raw material is ionized to the intermediate compound.

13. The method of claim 1, wherein only the second etching gas is introduced in the susceptor.

14. The method of claim 1, wherein both of the first etching gas and the second etching gas are introduced in the susceptor.

15. The method of claim 13, wherein the first etching gas is firstly introduced and then the second etching gas is introduced.

16. The method of claim 13, wherein introduced amounts of the first etching gas and the second etching gas are different from each other.

17. The method of claim 14, wherein the introduced amount of the second etching gas is more than the introduced amount of the first etching gas.

18. The silicon carbide epitaxial wafer of claim 10, wherein the surface roughness of about 0.1 nm to 1 nm.

* * * * *